US012631733B2

(12) United States Patent
Scozzola

(10) Patent No.: US 12,631,733 B2
(45) Date of Patent: May 19, 2026

(54) CONTACTLESS ACTIONABLE BUTTON

(71) Applicant: STMicroelectronics (Grenoble 2) SAS, Grenoble (FR)

(72) Inventor: Giovanni Scozzola, Saint Egreve (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 1309 days.

(21) Appl. No.: 17/406,625

(22) Filed: Aug. 19, 2021

(65) Prior Publication Data

US 2022/0066001 A1     Mar. 3, 2022

(30) Foreign Application Priority Data

Sep. 3, 2020    (FR) ...................................... 2008966

(51) Int. Cl.
| | |
|---|---|
| *G01S 7/4865* | (2020.01) |
| *G06F 3/042* | (2006.01) |
| *H03K 17/94* | (2006.01) |
| *H03K 17/945* | (2006.01) |

(52) U.S. Cl.
CPC .......... *G01S 7/4865* (2013.01); *G06F 3/0421* (2013.01); *H03K 17/941* (2013.01); *H03K 17/945* (2013.01); *H03K 2017/9455* (2013.01)

(58) Field of Classification Search
CPC ... G01S 7/4865; G06F 3/0421; H03K 17/941; H03K 17/945; H03K 2017/9455; H03K 2217/94108
See application file for complete search history.

(56) References Cited

U.S. PATENT DOCUMENTS

| | | | |
|---|---|---|---|
| 2010/0054493 A1* | 3/2010 | Lin ...................... | H01H 9/0228 381/74 |
| 2015/0268342 A1 | 9/2015 | Iott et al. | |
| 2021/0014597 A1* | 1/2021 | Andersen ................. | H04R 3/04 |
| 2021/0386366 A1* | 12/2021 | Zakharov ................. | A61B 3/00 |
| 2022/0011870 A1* | 1/2022 | Nakaya ..................... | A61L 2/10 |
| 2023/0161443 A1* | 5/2023 | Ziraknejad .............. | B66B 1/461 327/517 |

* cited by examiner

*Primary Examiner* — Isam A Alsomiri
*Assistant Examiner* — Joseph C Fritchman
(74) *Attorney, Agent, or Firm* — Slater Matsil, LLP

(57)     ABSTRACT

The present description concerns a button capable of being activated by the proximity of a user's finger, including: a time-of-flight distance sensor; and a control circuit, coupled to the distance sensor and configured to transmit a control signal, where the control circuit is configured to perform a switching of the signal, between a first state and a second state, conditioned at least by the detection by the sensor, for a first time period, of an object at a distance shorter than a first threshold.

20 Claims, 4 Drawing Sheets

CONTACTLESS ACTIONABLE BUTTON

CROSS-REFERENCE TO RELATED APPLICATIONS

This application claims priority to French Patent Application No. 2008966, filed on Sep. 3, 2020, which application is hereby incorporated herein by reference.

TECHNICAL FIELD

The present disclosure generally concerns electronic devices. The present disclosure more particularly concerns devices enabling to switch a control signal between a first state and a second state.

BACKGROUND

Many devices enabling to switch a control signal between a first state and a second state, such as switches, circuit breakers, push-buttons, etc. are known. These devices generally require a pressing, for example by a user's finger, to cause the switching of the control signal. This particularly causes hygiene problems, for example, when different users successively press on the same device.

SUMMARY

Embodiments improve devices and methods for switching a control signal between a first state and a second state.

An embodiment overcomes all or part of the disadvantages of methods and devices for switching a control signal between a first known state and a second known state.

An embodiment provides a button capable of being activated by the proximity of a user's finger, comprising a time-of-flight distance sensor; and a control circuit, coupled to the distance sensor and configured to transmit a control signal, where the control circuit is configured to perform a switching of the signal, between a first state and a second state, conditioned at least by the detection by the sensor, for a first time period, of an object at a distance shorter than a first threshold.

According to an embodiment, the control circuit is configured to perform the switching of the control signal as a response to the detection by the sensor, for the first time period, of the object at a distance shorter than the first threshold.

According to an embodiment, the switching of the control signal, performed by the control circuit, is further conditioned by a removing of the object all the way to a distance, with respect to the sensor, greater than a second threshold, the second threshold being greater than the first threshold.

According to an embodiment, the control circuit is configured to keep the control signal in the first state in case of a detection by the sensor, for a second time period longer than the first time period, of the object at a distance shorter than the second threshold.

According to an embodiment, the first threshold is in the range from 1 mm to 4 m, preferably from 1 mm to 1 m.

According to an embodiment, the button further comprises a light emission device configured to notify the activation of the button.

According to an embodiment, the button further comprises a sound emission device configured to notify the activation of the button.

According to an embodiment, the first time period is in the range from 50 ms to 30 s.

According to an embodiment, the sensor is configured to periodically estimate the distance separating the object from the sensor.

According to an embodiment, the sensor is configured to estimate the distance: at a first frequency, as long as the object is detected at a distance greater than the second threshold; and at a second frequency, greater than the first frequency, when the object is detected at a distance shorter than the second threshold.

An embodiment provides a method of activation of a button by the proximity of a finger, the method comprising: a) the switching, by a control circuit, of a control signal between a first state and a second state, the switching being conditioned at least by the detection by a time-of-flight distance sensor, for a second time period, of an object at a distance shorter than a first threshold; and b) the transmission of the control signal by the control circuit.

According to an embodiment, the switching of the control signal, by the control circuit, is further conditioned by a removing of the object all the way to a distance, with respect to the sensor, greater than a second threshold, the second threshold being greater than the first threshold.

According to an embodiment, the control signal is kept, by the control circuit, in the first state in case of a detection by the sensor, for a second time period greater than the first time period, of the object at a distance shorter than the second threshold.

An embodiment provides a non-transient storage memory, comprising instructions implementing the method such as described when they are executed by a processor.

An embodiment provides a system comprising a processing device; and a plurality of buttons such as described, coupled to the processing device, where the processing device is configured to receive the control signal of each button.

BRIEF DESCRIPTION OF THE DRAWINGS

The foregoing and other features and advantages of the present invention will be discussed in detail in the following non-limiting description of specific embodiments and implementation modes in connection with the accompanying drawings, in which.

DETAILED DESCRIPTION OF ILLUSTRATIVE EMBODIMENTS

Figure 1:
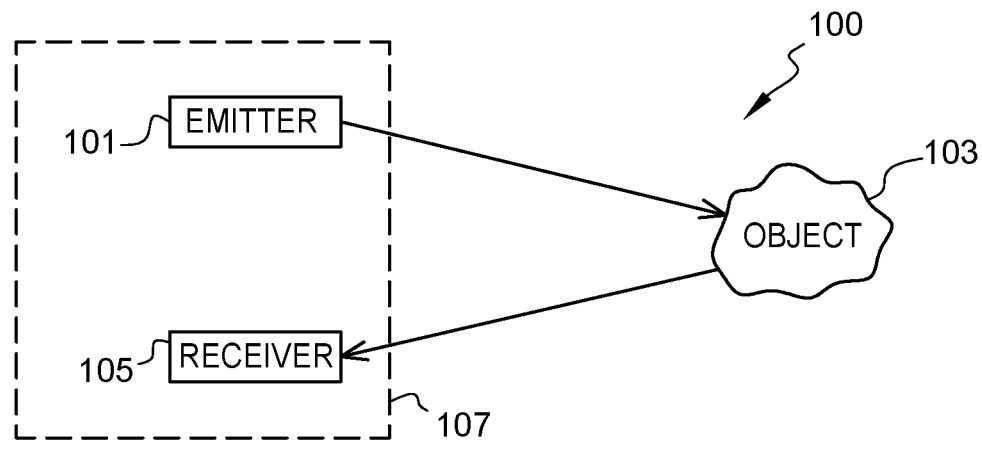
FIG. 1 schematically and partially shows a system of time-of-flight distance estimation.

Like features have been designated by like references in the various figures. In particular, the structural and/or functional elements common to the different embodiments and implementation modes may be designated with the same reference numerals and may have identical structural, dimensional, and material properties.

For clarity, only those steps and elements which are useful to the understanding of the described embodiments and implementation modes have been shown and will be detailed. In particular, the operation of the time-of-flight distance sensors has not been detailed, the embodiments and implementation modes being compatible with usual time-of-flight distance sensors.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

Unless specified otherwise, the expressions "around", "approximately", "substantially" and "in the order of" signify within 10%, and preferably within 5%.

FIG. 1 schematically and partially shows a system of time-of-flight (ToF) distance estimation system wo.

In the illustrated example, system wo comprises a light emission device 101 (EMITTER). Light emission device 101 for example transmits, towards an object 103 (OBJECT) of a scene, light pulses or a light waveform. A return signal, for example resulting from a reflection of these light pulses or of this waveform on the object 103 of the scene, is for example detected by a light reception device 105 (RECEIVER).

As an example, emission and reception devices 101 and 105 form part of a same device 107, for example a time-of-flight distance sensor, sometimes also called time-of-flight camera.

As an example, device 107 may implement so-called direct (dToF) or indirect (iToF) time-of-flight distance measurements.

In the case of direct time-of-flight (dToF) measurements, a time period taken by each pulse, originating from light emission device 101, to reach light reception device 105, is for example estimated. The time of flight is thus determined and then converted into a distance measurement.

In the case of indirect time of flight (iToF) measurements, the phase of the signal received by light reception device 105 is for example compared with the phase of the signal emitted by light emission device 101. The time of flight is thus estimated and then converted into a distance measurement.

Figure 2:
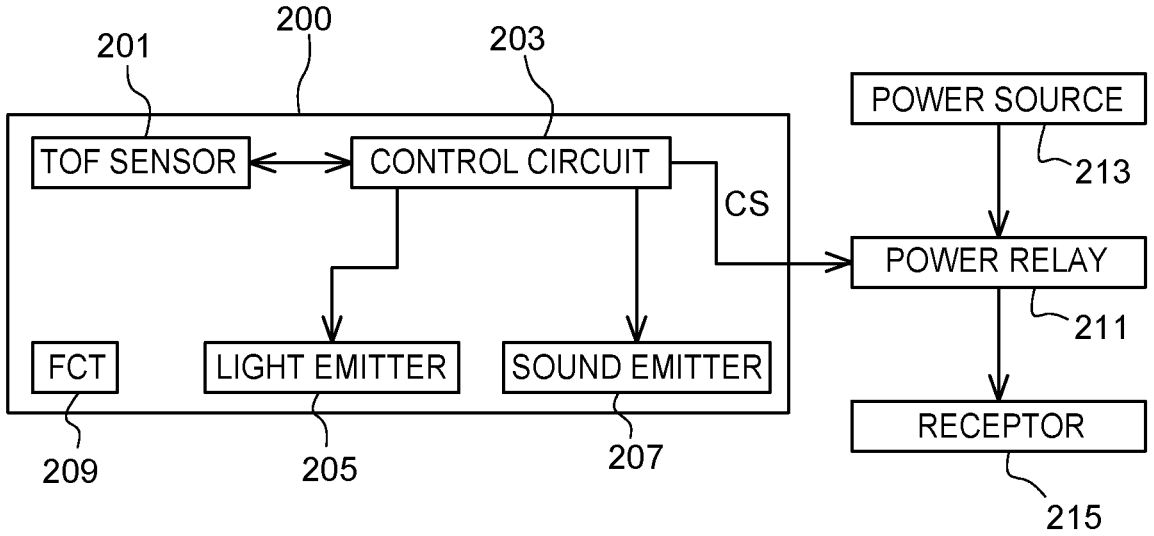
FIG. 2 schematically shows in the form of blocks a button capable of being activated without contact according to an embodiment.

FIG. 2 very schematically shows in the form of blocks a button 200 capable of being activated without contact according to an embodiment.

In the illustrated example, button 200 comprises a time-of-flight distance sensor 201 (TOF SENSOR), more simply called ToF sensor. As an example, the ToF sensor 201 of button 200 is of the type of the sensor 107 previously described in relation with FIG. 1.

In the illustrated example, button 200 further comprises a control circuit 203 (CONTROL CIRCUIT). Control circuit 203 is for example configured to control ToF sensor 201. Control circuit 203, for example, receives information representative of distances estimated by ToF sensor 201. As an example, control circuit 203 is a microcontroller, a microprocessor, etc.

In the illustrated example, button 200 further comprises a light emission device 205 (LIGHT EMITTER). Light emission device 205 is, for example, controlled by control circuit 203. Light emission device 205 is, for example, configured to emit a state information light signal, for example, a state feedback notifying an activation of button 200. Light emission device 205 is, for example, distinct from a light emission device, for example, similar to the device 101 of FIG. 1, implemented by ToF sensor 201 to illuminate objects of a scene. As an example, the light emission device is a light-emitting diode.

In the illustrated example, button 200 further comprises a sound emission device 207 (SOUND EMITTER). Sound emission device 207 is, for example, controlled by control circuit 203. Device 207 is, for example, configured to emit a state information sound signal, for example, a state feedback notifying an activation of button 200. As an example, sound emission device 207 is a loudspeaker, a beeper, an earcon, etc.

As an example, the light and sound signals respectively originating from light emission device 205 and from sound emission device 207 are emitted simultaneously during the activation of button 200.

As a variant, at least one of the two devices 205, 207 is omitted from button 200.

Button 200 may also comprise one or a plurality of other elements. These elements are symbolized, in FIG. 2, by a functional block 209 (FCT).

In the illustrated example, control circuit 203 is further configured to control a power relay 211 (POWER RELAY). Relay 211 for example receives from control circuit 203 a control signal CS. Signal CS is for example a binary signal, switchable between a first state, for example, a low state, noted CSL, and a second state, for example, a high state, noted CSH. Signal CS is for example used to control, according to its state, the opening or the closing of at least one power contact of relay 211. As an example, relay 211 is an electromechanical relay or a static relay. As a variant, relay 211 may be replaced with other types of switching devices, for example, a transistor.

In the illustrated example, relay 211 is interposed between a power source 213 (POWER SOURCE) and a receiver 215 (RECEPTOR). Power source 213 is for example an electric power source delivering a continuous current, for example, a battery, or an AC current source, for example, a mains power supply. As an example, receiver 215 is an actuator, for example, an electric motor, or a lamp. More generally, receiver 215 may correspond to any type of electric receiver capable of being powered on or powered off via relay 211.

As a variant, power source 213 is a hydraulic or pneumatic power source, for example, a compressed air network. Relay 211 is then for example replaced with an electrovalve and receiver 215 is for example a pneumatic actuator.

FIG. 2 shows an example where relay 211 is external to button 200. However, relay 211 may as a variant be integrated to button 200.

Although this has not been shown in FIG. 2, the elements of button 200 are for example electrically powered by source 215.

Figure 3A:
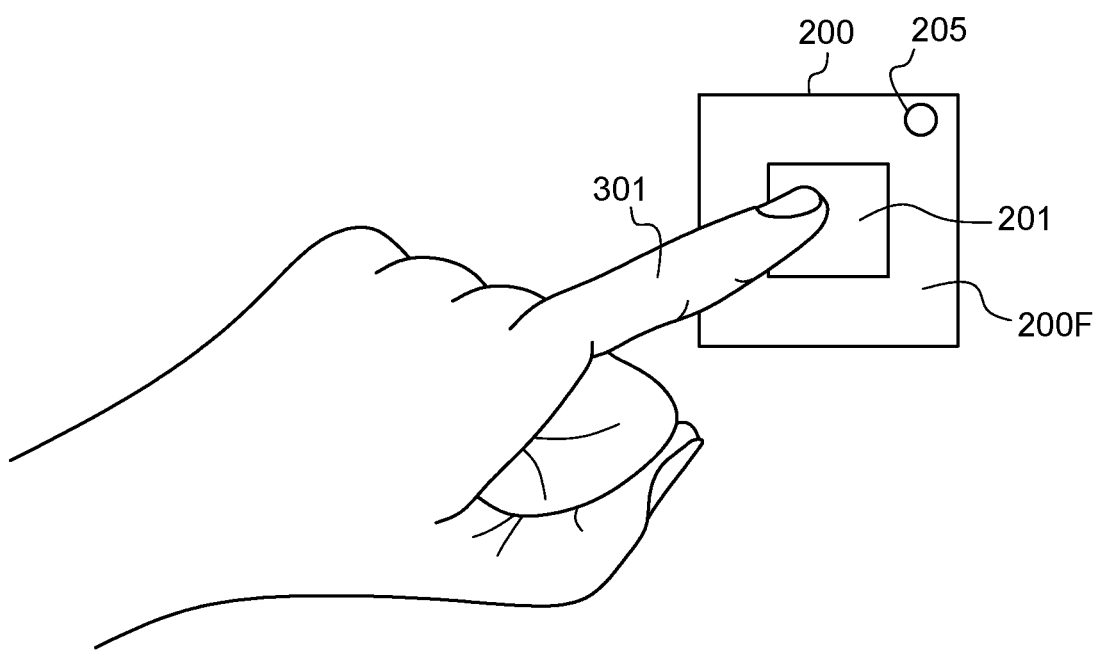
FIG. 3A is a perspective view of an example of implementation of the button of FIG. 2.
Figure 3B:
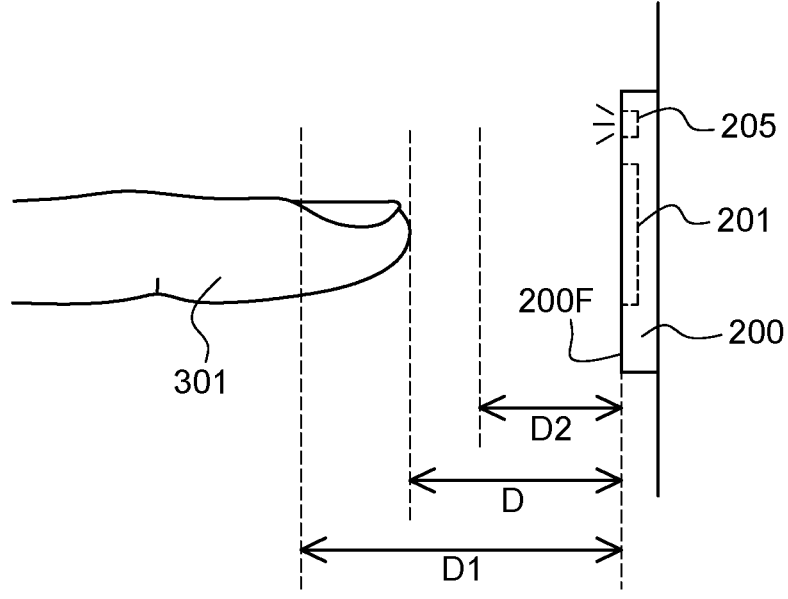
FIG. 3B is a side view of an example of implementation of the button of FIG. 2.

FIGS. 3A and 3B are respective perspective and side views of an embodiment of the button 200 of FIG. 2. For clarity, only ToF sensor 201 and light emission device 205 have been shown in FIGS. 3A and 3B.

In the illustrated example, a finger 301 of a user desiring to activate button 200 is located close to button 200. More particularly, the end of the user's finger 301 is separated from button 200 by a distance D, so that the user dos not touch button 200. For simplification, it is assumed, as illustrated in FIG. 3B, that ToF sensor 201 is flush with a front surface 200F of button 200, that is, the surface of button 200 located in front of the user's finger 301. In this case, the user's finger 301 is thus also separated from ToF sensor 201 by distance D.

FIG. 3B shows two distance thresholds D1 and D2. In the illustrated example, distance threshold D1 is greater than distance threshold D2. The values of thresholds D1 and D2 are for example parameterized in control circuit 203. As an example, distance threshold D2 is in the range from 1 mm to 4 m, preferably in the range from 1 mm to 1 m, for example, equal to approximately 10 mm.

In the illustrated example, the distance D separating the end of finger 301 from ToF sensor 201 is between thresholds D1 and D2 (D2<D<D1). This for example corresponds to an operation during which the user brings the end of his/her finger 301 towards button 200.

According to an implementation mode, the control circuit 203 (FIG. 2) of button 200 is configured to perform a switching of control signal CS, between first state CSL and second state CSH, conditioned at least by the detection by sensor 201, for a first time period, of an object at a distance D shorter than threshold D2. Control circuit 203 is for example configured to switch control signal CS as a response to the detection by sensor 201, for the first time period, of the object at a distance D shorter than threshold D2. As a variant, the switching of control signal CS, performed by control circuit 203, is for example further conditioned by the removing of the object all the way to a distance D, with respect to sensor 201, greater than threshold D1. Further, control circuit 203 is for example configured to keep control signal CS in first state CSL in case of a detection by sensor 201, for a second time period greater than the first time period, of the object at a distance D shorter than threshold D1.

Figure 4:
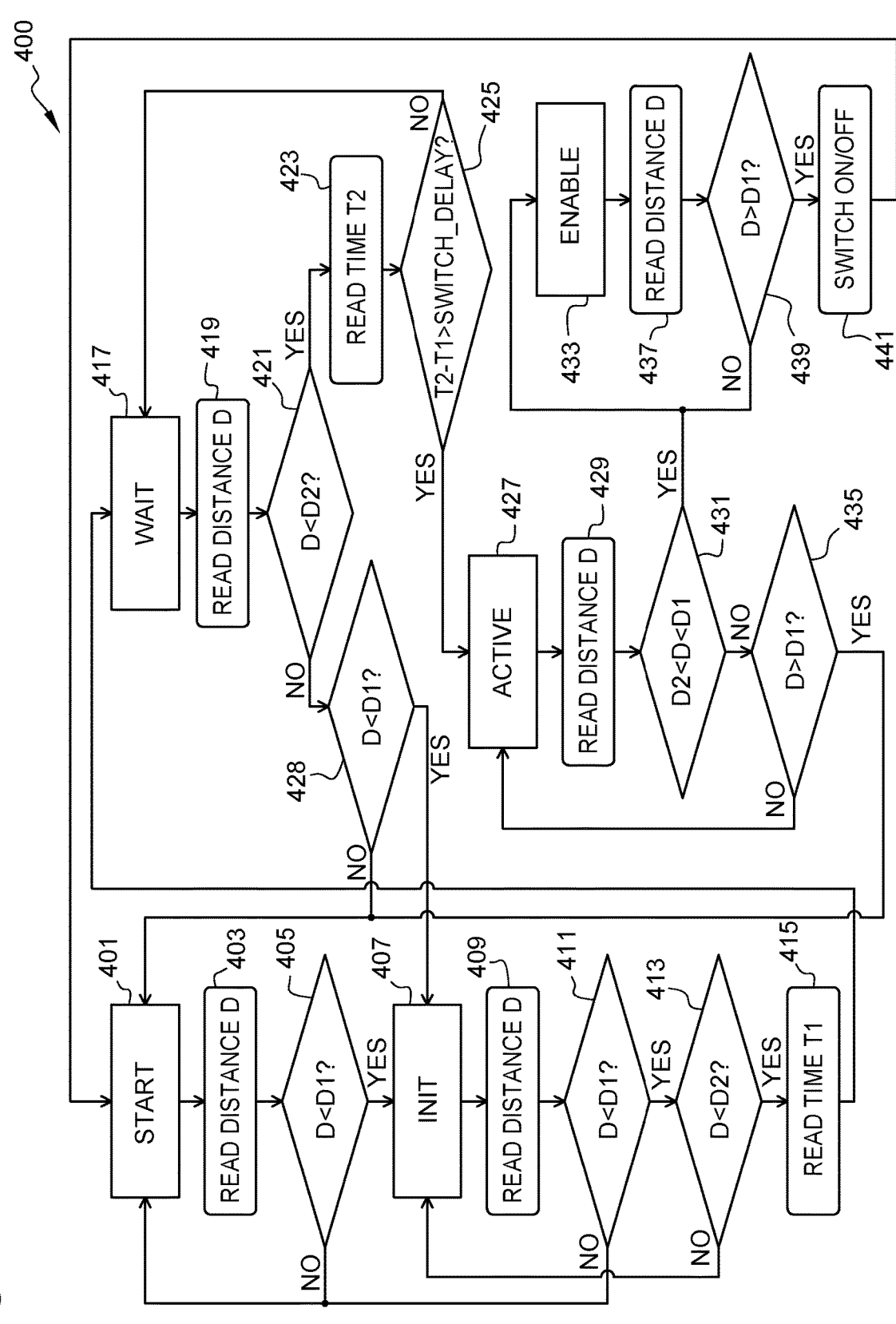
FIG. 4 is a logic diagram illustrating a method of activation of the button of FIG. 2 according to an implementation mode.

A more elaborate activation method may also be provided, for example, such as that which is discussed hereafter in relation with FIG. 4.

FIG. 4 is a logic diagram illustrating steps of a method 400 of activation of the button 200 of FIGS. 2 and 3 according to an implementation mode. The method 400 of FIG. 4 is for example executed by the control circuit 203 of button 200. As an example, control circuit 203 may comprise a non-transient storage memory, comprising instructions implementing method 400 when they are executed by control circuit 203.

In the illustrated example, method 400 starts with an initial step 401 (START). Initial step 401 for example corresponds to a step of initialization of the elements of button 200. In the illustrated example, from initial step 401, the ToF sensor 201 of button 200 performs distance measurements until an object, for example, the user's finger 301, is detected at a distance D shorter than threshold D1. These distance measurements are for example performed periodically, for example, at a frequency corresponding to a low-consumption mode of ToF sensor 201.

In the illustrated example, ToF sensor 201 performs a distance measurement D at a step 403 (READ DISTANCE D). Then, at a step 405 (D<D1?), the distance D separating a possible object from ToF sensor 201 is compared with distance threshold D1. If an object is effectively present at a distance D shorter than threshold D1 (output YES), it is then proceeded to a step 407 (INIT). In the opposite case (output NO), that is, if no object is separated from ToF sensor 201 by a distance D shorter than threshold D1, it is returned to initial step 401.

Step 407 for example corresponds to a step of coming out of a standby mode of button 200. As an example, the frequency at which ToF sensor 201 performs the distance measurements increases from step 407.

In the illustrated example, the method carries on by the verifying of whether the object, previously detected at a distance D shorter than threshold D1 during step 405, is then brought closer to button 200, to a distance D shorter than threshold D2.

More particularly, ToF sensor 201 performs another measurement of distance D at a step 409 (READ DISTANCE D). Then, at a step 411 (D<D1?), the distance D separating the object from ToF sensor 201 is compared again with distance threshold D1. If distance D is shorter than threshold D1 (output YES), it is then proceeded to a step 413 (D<D2?). In the opposite case (output NO), that is, for example, if the object is no longer separated from ToF sensor 201 by a distance D shorter than threshold D1, it is returned to initial step 401. This particularly enables to avoid an untimely activation of button 200, for example, in case where the object passes close to ToF sensor 201 by accident.

At step 413, the distance D separating the object from ToF sensor 201 is compared with distance threshold D2. If distance D is shorter than threshold D2 (output YES), it is then proceeded to a step 415 (READ TIME T1). In the opposite case (output NO), that is, for example, if the object remains separated from ToF sensor 201 by a distance D greater than threshold D2, it is returned to step 407.

At step 415, a time T1 when the object is detected at a distance D shorter than threshold D2 is for example recorded, for example, in a memory of button 200.

From a step 417 (WAIT), subsequent to step 415, it is then desired to determine whether the object is kept at a distance D shorter than threshold D2 for a time period greater than a delay SWITCH_DELAY of activation of button 200.

More particularly, ToF sensor 201 performs still another measurement of distance D at a step 419 (READ DISTANCE D). Then, at a step 421 (D<D2?), the distance D separating the object from the ToF sensor 201 is compared again with distance threshold D2. If distance D is still shorter than threshold D2 (output YES), it is then proceeded to a step 423 (READ TIME T2).

At step 423, another time T2 when the object is detected again at a distance D shorter than threshold D2 is for example recorded, for example, in a memory of button 200.

At a step 425 (T2–T1>SWITCH_DELAY?), it is verified whether time T2 is separated from time T1 by a time period greater than delay SWITCH_DELAY of activation of button 200. If such is the case (output YES), it is then proceeded to a step 427 (ACTIVE) of activation of button 200. As an example, delay SWITCH_DELAY of activation of button 200 is in the range from 50 ms to 30 s, for example, equal to 1 s.

However, if the object is no longer separated from ToF sensor 201 by a distance D shorter than threshold D2 at step 421 (output NO), it is proceeded to a step 428 (D<D1?). At step 428, the distance D separating the object from ToF sensor 201 is compared with distance threshold D1. If distance D is shorter than threshold D1 (output YES), for example, if the object has moved away to a distance D in the range from thresholds D1 and D2, it is then returned to step 407. In the opposite case (output NO), that is, if the object is detected by ToF sensor 201 at a distance D greater than threshold D1, it is returned to initial step 401.

At activation step 427, the light emission device 205 and the sound emission device 207 of button 200 for example respectively emit a light signal and a sound signal, for example, simultaneously. This for example enables to indicate to the user that its request for an activation of button 200 has been taken into account. The user is then enticed to remove his/her finger from button 200 to achieve the switching of control signal CS.

From step 427 of activation of button 200, it is then attempted to determine whether the object, after having been kept at a distance D shorter than threshold D2 for a time period greater than delay SWITCH_DELAY, is removed from ToF sensor 201 all the way to a distance D greater than threshold D2.

More particularly, ToF sensor 201 performs still another measurement of distance D at a step 429 (READ DISTANCE D). Then, at a step 431 (D2<<D1?), the distance D separating the object from ToF sensor 201 is compared with distance thresholds D2 and D1. If distance D is between thresholds D1 and D2 (output YES), it is then proceeded to a step 433 (ENABLE). In the opposite case (output NO), that is, if distance D is not between thresholds D1 and D2, it is then proceeded to a step 435 (D>D1?). At step 435, the distance D separating the object from ToF sensor 201 is once again compared with threshold D1. If distance D is greater than threshold D1 (output YES), for example, if the object has disappeared from a detection field of ToF sensor 201, it is returned to initial step 401. In the opposite case (output NO), that is, if distance D is shorter than threshold D1, it is then returned to step 427 of activation of button 200.

From step 433, it is then attempted to determine whether the object keeps moving away from ToF sensor 201 to reach a distance D greater than threshold D1.

More particularly, ToF sensor 201 performs still another measurement of distance D at a step 437 (READ DISTANCE D). Then, at a step 439 (D>D1?), the distance D separating the object from ToF sensor 201 is compared with distance threshold D1. If distance D is greater than distance threshold D1 (output YES), it is then proceeded to a step 441 (SWITCH ON/OFF). In the opposite case (output NO), that is, if distance D is not greater than threshold D1, it is then returned to 433.

As a variant, after step 429, it is verified whether distance D is greater than threshold D2 but it is not verified whether distance D is shorter than threshold D1. In this case, steps 431 and 435 are for example replaced with a single step comprising comparing distance D with distance threshold D2. If distance D is greater than threshold D2, it is for example proceeded to step 433. In the opposite case, if distance D is shorter than threshold D2, it is for example returned to step 427. A delay may then be provided to leave step 427 and for example return to initial step 401 in case of a prolonged keeping of an object at a distance D shorter than D2.

Another variant would comprise, after step 429, directly verifying that distance D becomes greater than threshold D1. In this case, steps 431 and 435 are for example replaced with a single step comprising comparing distance D with distance threshold D1. If distance D is greater than threshold D1, it is for example proceeded to step 433. In the opposite case, if distance D is shorter than threshold D1, it is for example returned to step 427. A delay may then be provided to leave step 427 and for example return to initial step 401 in case of a prolonged keeping of an object at a distance D shorter than D1.

At step 441, button 200 is switched. As an example, the control signal CS transmitted by control circuit 203 is switched from the low state to the high state at step 441. It is then returned to initial step 401. Such a returning to initial step 401 for example goes along with a setting to the standby mode of the elements of button 200.

Although this has not been shown, it may for example be provided to return to step 407 if an object is kept at a distance D shorter than distance D2 for a time period greater than delay SWITCH_DELAY, for example, greater than twice delay SWITCH_DELAY. This particularly enables to avoid an untimely switching of control signal CS, for example, in a case where an object is placed close to ToF sensor 201 without desiring to activate button 200.

Figure 5:
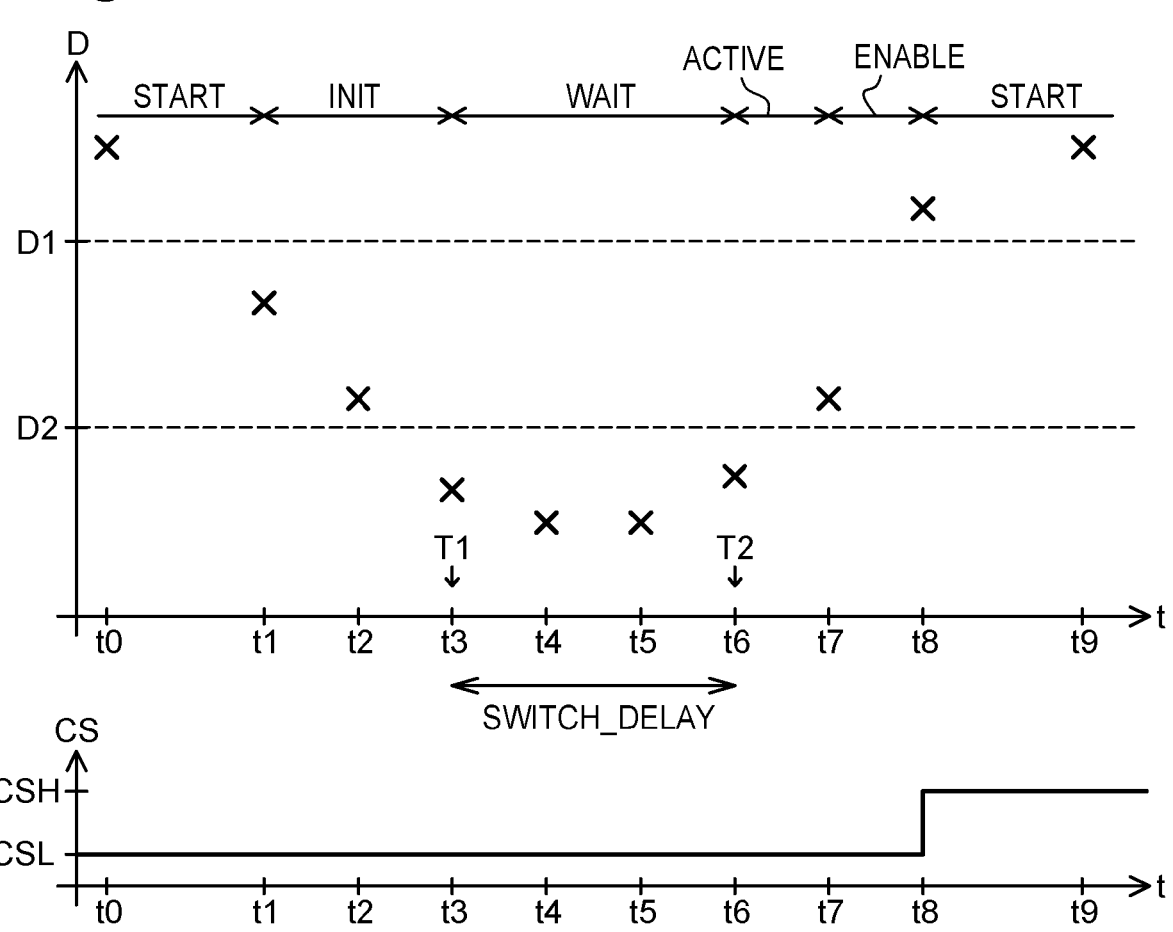
FIG. 5 is a timing diagram associated with the activation method of FIG. 4.

FIG. 5 is a timing diagram associated with the activation method 400 of FIG. 4.

At the start, button 200 is for example in a state (START) corresponding to the initial step 401 previously described in relation with FIG. 4. Further, the control signal CS transmitted by control circuit 203 is for example at low state CSL.

At a time t0, ToF sensor 201 measures distance D. In the illustrated example, at time to, an object, for example, the user's finger 301, is separated from ToF sensor 201 by a distance D greater than distance threshold D1. Button 200 is thus kept in state START corresponding to step 401.

At a time t1, subsequent to time t0, ToF sensor 201 performs another measurement of distance D. In the illustrated example, at time t1, the object is located at a distance D shorter than distance threshold D1. Button 200 thus switches from state START, corresponding to step 401, to another state (INIT), for example corresponding to the step 407 previously described in relation with FIG. 4.

In the illustrated example, the measurement frequency of ToF sensor 201 increases from time t1.

At a time t2, subsequent to time t1, ToF sensor 201 performs still another measurement of distance D. In the illustrated example, at time t2, the object is located at a distance D shorter than distance threshold D1 but greater than distance threshold D2. Button 200 is thus kept in state INIT corresponding to step 407.

At a time t3, subsequent to time t2, ToF sensor 201 performs still another measurement of distance D. In the illustrated example, at time t3, the object is located at a distance D shorter than distance threshold D2. Button 200 thus switches from state INIT, corresponding to step 407, to still another step (WAIT), for example corresponding to the step 417 previously described in relation with FIG. 4. This for example causes the storage of time T1, time t3 for example marking the beginning of a countdown compared with delay SWITCH_DELAY.

At successive times t4 and t5, subsequent to time t3, ToF sensor 201 performs still other measurements of distance D. In the illustrated example, at each time t4, t5, the object is located at a distance D shorter than distance threshold D2. Button 200 is thus kept in state WAIT corresponding to step 417.

At a time t6 subsequent to time t5, ToF sensor 201 performs still another distance measurement D. In the illustrated example, at time t6, the object is located at a distance D shorter than distance threshold D2. Further, time t6 for example marks the end of delay SWITCH_DELAY. The object having been detected at a distance D shorter than threshold D2 for delay SWITCH_DELAY, button 200 switches from state WAIT, corresponding to step 417, to still another state (ACTIVE), for example corresponding to the step 427 previously described in relation with FIG. 4.

At a time t7 subsequent to time t6, ToF sensor 201 performs still another measurement of distance D. In the illustrated example, at time t7, the object is located at a distance D between thresholds D1 and D2. Button 200 then switches from state ACTIVE, corresponding to step 427, to still another state (ENABLE), for example corresponding to the step 433 previously described in relation with FIG. 4.

At a time t8 subsequent to time t7, ToF sensor 201 performs still another measurement of distance D. In the illustrated example, at time t8, the object is located at a distance D greater than threshold D1. At time t8, control signal CS is for example switched from low state CSL to high state CSH. Button 200 then switches from state ENABLE, corresponding to step 433, to state START corresponding to step 401.

In the illustrated example, the measurement frequency of ToF sensor 201 decreases from time t8.

At a time t9, subsequent to time t8, ToF sensor 201 performs still another measurement of distance D. In the illustrated example, at time t9, the object is located at a distance D greater than distance threshold D1. Button 200 is thus kept in the state START corresponding to initial step 401.

Figure 6:
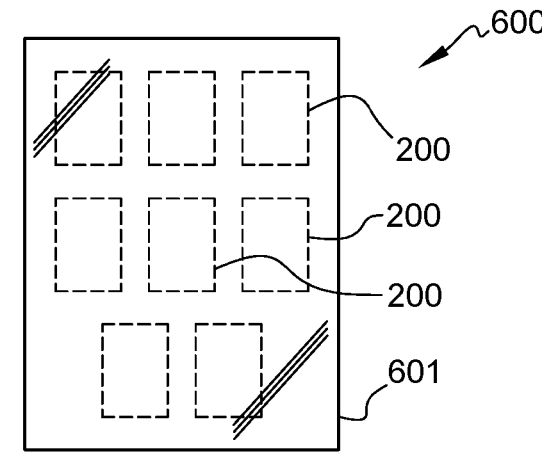
FIG. 6 schematically shows an example of a system comprising a plurality of buttons capable of being activated without contact.

FIG. 6 schematically shows an example of a system 600 comprising a plurality of buttons 200 capable of being activated without contact.

In the illustrated example, system 600 comprises eight buttons 200, symbolized by rectangles in dotted lines in FIG. 6. This example is however not limiting, and system 600 may comprise any number, greater than two, of buttons 200 capable of being activated without contact.

As an example, system 600 corresponds to an operating panel of an elevator (not shown), to a landing operating panel, to a building intercom system, etc. More generally, system 600 may correspond to any type of man-machine interface enabling to switch one or a plurality of signals between two states. In the case of an elevator operating panel, certain buttons 200 of system 600 for example enable to select a floor, to control the closing or the opening of the elevator doors, etc.

In the illustrated example, the buttons 200 of system 600 are located between a transparent wall 601, for example, a glass pane. This particularly enables to avoid for dust to lodge between buttons 200 or for humidity to penetrate into buttons 200. Further, this tends to ease operations of cleaning of system 600.

Although this has not been shown in FIG. 6, the buttons 200 of system 600 are for example coupled to a same processing device. The processing device for example receives the control signal CS of each button 200 of system 600. As an example, the processing device is particularly configured to arbitrate priorities in case of a simultaneous activation of a plurality of buttons 200. The processing device is for example capable of avoiding untimely activations, for example, in a case where an object is located, with respect to at least two buttons 200, at a distance shorter than threshold D1.

An advantage of contactless button 200 lies in the fact that it has a better appearance than a push button. The implementation of button 200 particularly avoids for finger marks to be left by the user during its activation. Further, button 200 requires no pressing or rotation mechanism comprising moving parts, which enables to increase its lifetime and to ease its protection against dust and humidity.

Another advantage of button 200 capable of being activated without contact lies in the fact that it is more hygienic than a push button. The implementation of button 200 particularly avoids for bacteria or viruses to be deposited at its surface by a user and to be transmitted to another user.

Various embodiments, implementation modes, and variants have been described. Those skilled in the art will understand that certain features of these various embodiments, implementation modes, and variants, may be combined and other variants will occur to those skilled in the art. In particular, it will be within the abilities of those skilled in the art to adapt the implementation mode of the method 400 discussed in relation with FIG. 4 so that the switching of control signal CS occurs without verifying the distance of the object after delay SWITCH_DELAY has elapsed, for example from as soon as step 427.

Further, although the described embodiments and implementation modes take as an example the case of a switching of control signal CS from low state CSL to high state CSH, it will be within the abilities of those skilled in the art to adapt what has been described to a switching of control signal CS from high state CSH to low state CSL.

Finally, the practical implementation of the described embodiments, implementation modes, and variants is within the abilities of those skilled in the art based on the functional indications given hereabove. In particular, the physical implementation of the elements in button 200 is within the abilities of those skilled in the art based on the above indications.

What is claimed is:

1. An electronic device comprising:
a button;
a time-of-flight (ToF) distance sensor disposed in the button, the ToF distance sensor being configured to detect a distance between an object and the button; and
a control circuit disposed in the button, the control circuit being coupled to the ToF distance sensor and configured to transmit a control signal, wherein the control circuit is configured to perform a switching of the control signal, between a first state and a second state, based on a detection by the ToF distance sensor, for a first time period, of the object at a distance shorter than a first threshold distance, the first threshold distance being in the range from 1 mm to 4 m, and the first time period being in the range from 50 ms to 30 s,
wherein the switching of the control signal, performed by the control circuit, is further based on moving the object to a distance greater than a second threshold distance from the button, the second threshold distance being greater than the first threshold distance, and
wherein the control circuit is configured to keep the control signal in the first state in response to a detection by the ToF distance sensor, for a second time period greater than the first time period, of the object at a distance shorter than the second threshold distance.

2. The electronic device according to claim 1, wherein the second threshold distance is in the range from 1 mm to 10 m.

3. The electronic device according to claim 1, wherein the ToF distance sensor is configured to determine the distance separating the object from the ToF distance sensor,
at a first frequency, as long as the object is detected at a distance greater than the second threshold distance; and
at a second frequency, greater than the first frequency, when the object is detected at a distance shorter than the second threshold distance.

4. The electronic device according to claim 1, wherein the first threshold distance is in the range from 1 mm to 1 m.

5. The electronic device according to claim 1, further comprising a light emission device configured to notify activation of the button.

6. The electronic device according to claim 1, further comprising a sound emission device configured to notify activation of the button.

7. The electronic device according to claim 1, wherein the ToF distance sensor is configured to periodically determine the distance separating the object from the ToF distance sensor.

8. A method of activating a button, the method comprising:

switching, by a control circuit, of a control signal between a first state and a second state, the switching being based on a detection by a time-of-flight (ToF) distance sensor, for a first time period, of an object at a distance shorter than a first threshold distance, the first threshold distance being in the range from 1 mm to 4 m, and the first time period being in the range from 50 ms to 30 s, wherein the switching of the control signal, by the control circuit, is further based on moving the object to a distance greater than a second threshold distance from the button, the second threshold distance being greater than the first threshold distance;

keeping, by the control circuit, in the first state in response to determining by the ToF distance sensor, for a second time period greater than the first time period, of the object at a distance shorter than the second threshold distance; and transmitting the control signal by the control circuit.

9. The method according to claim 8, wherein the first time period is in the range from 50 ms to 30 s, and wherein the first threshold distance is in the range from 1 mm to 1 m.

10. The method according to claim 8, further comprising periodically determining, at the ToF distance sensor, the distance separating the object from the button.

11. The method according to claim 8, further comprising determining, at the ToF distance sensor, the distance separating the object from the button, wherein the determining is performed at a first frequency, as long as the object is detected at a distance greater than the second threshold distance, and performed at a second frequency, greater than the first frequency, when the object is detected at a distance shorter than the second threshold distance.

12. A non-transitory memory comprising instructions implementing the method according to claim 8 when they are executed by a processor.

13. The method according to claim 8, wherein the second threshold distance is in the range from 1 mm to 10 m.

14. A system comprising:

a processing device;

a plurality of buttons coupled to the processing device, wherein at least one of the plurality of buttons comprises a time-of-flight (ToF) distance sensor configured to detect a distance between an object and the at least one of the plurality of buttons; and a control circuit coupled to the ToF distance sensor and configured to transmit a control signal, the control circuit being configured to switch the control signal, between a first state and a second state, based on a detection by the ToF distance sensor, for a first time period, of the object at a distance shorter than a first threshold distance, the first threshold distance being in the range from 1 mm to 4 m, and the first time period being in the range from 50 ms to 30 s, the processing device being configured to receive the control signal from each of the at least one of the plurality of buttons, wherein switching the control signal, performed by the control circuit, is further based on moving the object to a distance greater than a second threshold distance from the at least one of the plurality of buttons, the second threshold distance being greater than the first threshold distance, and wherein the control circuit is configured to keep the control signal in the first state in response to a detection by the ToF distance sensor, for a second time period greater than the first time period, of the object at a distance shorter than the second threshold distance.

15. The system according to claim 14, wherein the first time period is in the range from 50 ms to 30 s, and wherein the first threshold distance is in the range from 1 mm to 1 m.

16. The system according to claim 14, wherein each ToF distance sensor is configured to determine the distance separating the object from the ToF distance sensor, at a first frequency, as long as the object is detected at a distance greater than the second threshold distance; and at a second frequency, greater than the first frequency, when the object is detected at a distance shorter than the second threshold distance.

17. The system according to claim 14, wherein the second threshold distance is in the range from 1 mm to 10 m.

18. The system according to claim 14, further comprising a light emission device configured to notify activation of the at least one of the plurality of buttons.

19. The system according to claim 14, further comprising a sound emission device configured to notify activation of the at least one of the plurality of buttons.

20. The system according to claim 14, wherein the ToF distance sensor is configured to periodically determine the distance separating the object from the ToF distance sensor.

* * * * *